(12) United States Patent
Wood

(10) Patent No.: US 6,683,932 B1
(45) Date of Patent: Jan. 27, 2004

(54) SINGLE-EVENT UPSET IMMUNE FREQUENCY DIVIDER CIRCUIT

(75) Inventor: Neil E. Wood, Centreville, VA (US)

(73) Assignee: BAE Systems, Information and Electronic Systems Integration, Inc., Nashua, NH (US)

(*) Notice: Subject to any disclaimer, the term of this patent is extended or adjusted under 35 U.S.C. 154(b) by 0 days.

(21) Appl. No.: 10/201,045

(22) Filed: Jul. 23, 2002

(51) Int. Cl.[7] .............................................. H03K 21/00
(52) U.S. Cl. ............................. 377/47; 377/54; 327/115
(58) Field of Search ....................... 377/47, 54; 327/115

(56) References Cited

U.S. PATENT DOCUMENTS

| | | | |
|---|---|---|---|
| 4,797,575 A | | 1/1989 | Lofgren |
| 5,023,890 A | * | 6/1991 | Konishi ........................ 375/34 |
| 6,043,692 A | * | 3/2000 | Linoff .......................... 327/117 |
| 6,094,103 A | | 7/2000 | Jeong et al. |
| 6,163,182 A | | 12/2000 | Canard et al. |
| 6,255,878 B1 | | 7/2001 | Gauvin et al. |
| 6,316,979 B1 | | 11/2001 | Keeth |
| 6,549,045 B1 | * | 4/2003 | Wang et al. ................. 327/115 |

FOREIGN PATENT DOCUMENTS

EP 0 583 839 B1 11/1997

\* cited by examiner

*Primary Examiner*—Margaret R. Wambach
(74) *Attorney, Agent, or Firm*—Daniel J. Long; Antony P. Ng; Bracewell & Patterson, L.L.P.

(57) ABSTRACT

A single-event upset immune frequency divider circuit is disclosed. The single-event upset immune frequency divider circuit includes a dual-path shift register, a dual-path multiplexor, and a summing circuit. The dual-path shift register has a clock input, one signal input pair and multiple signal output pairs. The dual-path multiplexor has multiple signal input pairs and one output pair. The signal input pairs of the dual-path multiplexor are respectively connected to the signal output pairs of the dual-input shift register. The dual-path multiplexor selects one of the signal output pairs of the dual-path shift register for feeding back into the signal input pair of the dual-path shift register. The summing circuit then sums the signal input pair of the dual-path shift register to generate an output clock signal that is a fraction of the frequency of an input clock signal at the clock input of the dual-path shift register.

18 Claims, 7 Drawing Sheets

SINGLE-EVENT UPSET IMMUNE FREQUENCY DIVIDER CIRCUIT

RELATED PATENT APPLICATION

The present patent application is related to a copending application U.S. Ser. No. 10/201,100, filed on even date, entitled "SINGLE-EVENT UPSET IMMUNE FLIP-FLOP CIRCUIT".

BACKGROUND OF THE INVENTION

1. Technical Field

The present invention relates to electronic circuits in general, and in particular to frequency divider circuits. Still more particularly, the present invention relates to a single-event upset immune frequency divider circuit.

2. Description of the Related Art

Frequency divider circuits are commonly used in electronic devices that include counting circuits, phase-locked loop circuits, and/or frequency synthesizer circuits. Generally speaking, frequency dividers are used to generate signals of relatively lower frequencies by dividing a high frequency signal already existed within an electronic system. For example, if a 50 MHz signal is desired from a 100 MHz clock signal existed within an electronic system, a frequency divider is used to divide the 100 MHz clock signal by two.

Referring now to the drawings and, in particular, to FIG. 1, there is depicted a block diagram of a frequency divider circuit according to the prior art. As shown, a frequency divider circuit 10 includes a D-type flip-flop circuit 11 and an inverter 12. An input clock signal is applied to a clock input of D-type flip-flop circuit 11, which transitions the logical state of a signal from an output Q to be equal to the logical state of an input signal at an input D when the input clock signal transitions from a logical low state to a logical high state. Inverter 12 applies to the input D a signal that is opposite in logical state to the output signal at output Q so that the output Q changes logical state in response to the rising edge of the input clock signal. As a result, the output signal at the output Q has a frequency that is one half of the input signal frequency.

One problem with prior art frequency divider circuits, such as frequency divider circuit 10, is that they are very susceptible to single-event upsets (SEUs) or single-event transients (SETs) that can result in runt pulses occurred on the clock path and subsequently phase shifts in the output signals. Consequently, it is desirable to provide an SEU immune frequency divider circuit.

SUMMARY OF THE INVENTION

In accordance with a preferred embodiment of the present invention, a single-event upset immune frequency divider circuit includes a dual-path shift register, a dual-path multiplexor, and a summing circuit. The dual-path shift register has a clock input, one signal input pair and multiple signal output pairs. The dual-path multiplexor has multiple signal input pairs and one output pair. The signal input pairs of the dual-path multiplexor are respectively connected to the signal output pairs of the dual-input shift register. The dual-path multiplexor selects one of the signal output pairs of the dual-path shift register for feeding back into the signal input pair of the dual-path shift register. The summing circuit then sums the selected signal output pair of the dual-path multiplexor to generate an output clock signal that is a fraction of the frequency of an input clock signal at the clock input of the dual-path shift register.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
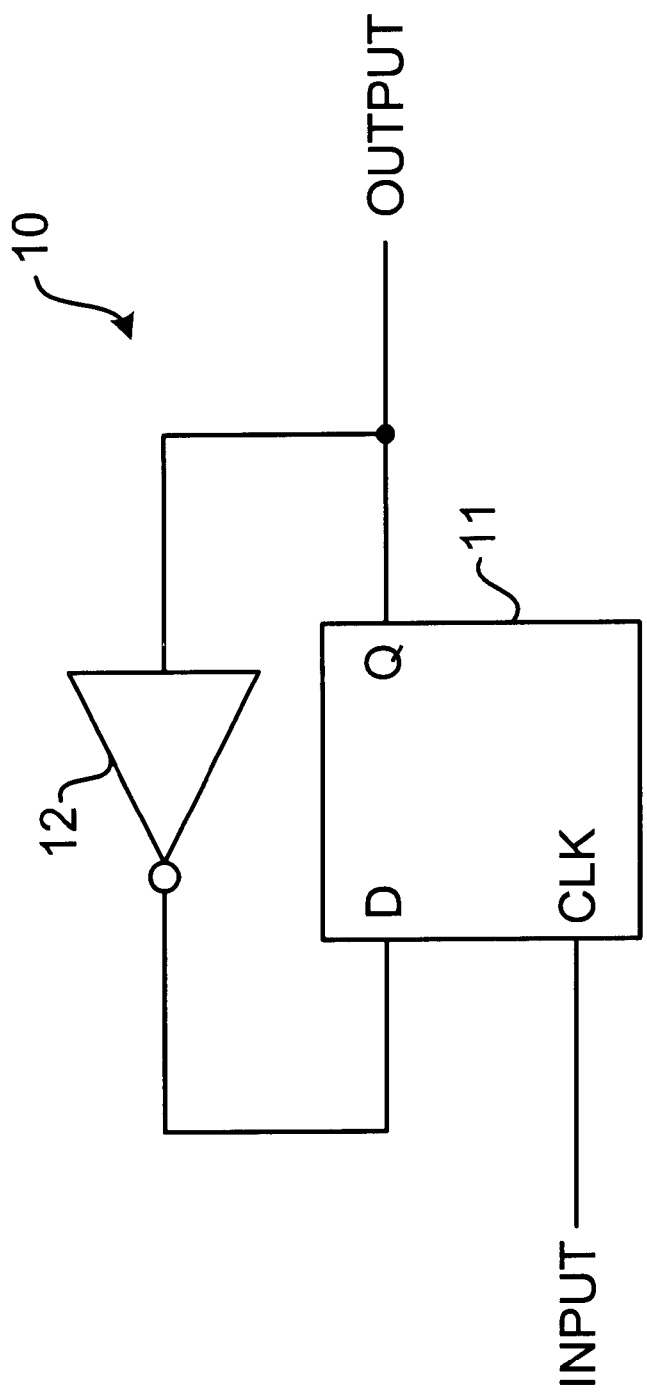
FIG. 1 is a block diagram of a frequency divider circuit according to the prior art.
Figure 2:
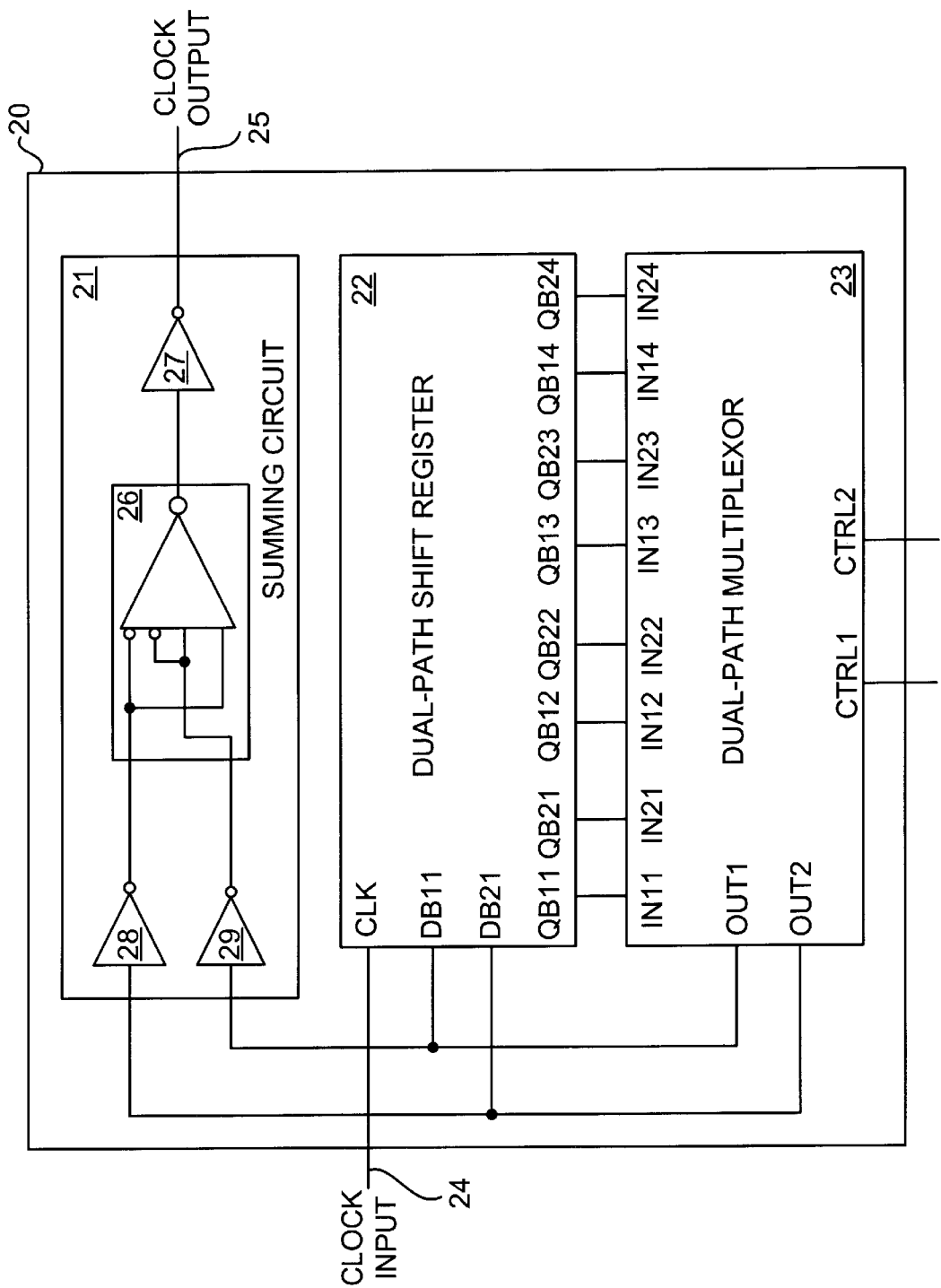
FIG. 2 is a block diagram of a single-event upset (SEU) immune frequency divider circuit, in accordance with a preferred embodiment of the present invention.

With reference now to FIG. 2, there is depicted a block diagram of a single-event upset (SEU) immune frequency divider circuit, in accordance with the preferred embodiment of the present invention. As shown, an SEU immune frequency divider circuit 20 includes a summing circuit 21, a dual-path shift register 22 and a dual-path multiplexor 23. SEU immune frequency divider circuit 20 also includes a clock input 24 and a clock output 25. Dual-path shift register 22 includes four output pairs, namely, QB11–QB21, QB12–QB22, QB13–QB23 and QB14–QB24. Dual-path multiplexor 23 may select any one of the four output pairs of dual-path shift register 22 to be fed back to an input pair DB11–DB12 of dual-path shift register 22. Depending on the selected output pair to be fed back, SEU immune frequency divider circuit 20 may divide an input clock signal from, for example, a system clock at clock input 24 by 2, 4, or 8 times in order to produce an output clock signal that is one-half, one-fourth, or one-eighth of the input clock signal, respectively, at clock output 25.

Summing circuit 21 is a tri-state circuit having a dual-input inverter 26 and inverters 27–29. The purpose of inverters 27–29 is to boost the strength of input/output signals to/from summing circuit 21. Dual-input inverter 26 has two inputs and one output. Dual-input inverter 26 sums the two outputs from dual-path multiplexor 23 to produce a single output at clock output 25 for SEU immune frequency divider circuit 20. Dual-input inverter 26 preferably includes two serially connected p-channel transistors connected in series with two serially connected n-channel transistors. Each of the two inputs of dual-input inverter 26, which is provided by connecting the gates of a p-channel transistor and an n-channel transistor, is connected to one of the two outputs of dual-path multiplexor 23. For example, if the four transistors within dual-input inverter 26 are labelled as p-channel transistors a, b and n-channel transistors c, d, then OUT1 from dual-path multiplexor 23 can be connected to the gates of both p-channel transistor a and n-channel transistor c (via inverter 29) while OUT2 from dual-path multiplexor 23 can be connected to the gates of p-channel transistor b and n-channel transistor d (via inverter 28). Alternatively, OUT1 from dual-path multiplexor 23 can be connected to the gates of both p-channel transistor b and n-channel transistor c (via inverter 29) while OUT2 from dual-path multiplexor 23 can be connected to the gates of both p-channel transistor a and n-channel transistor d (via inverter 28).

Figure 3:
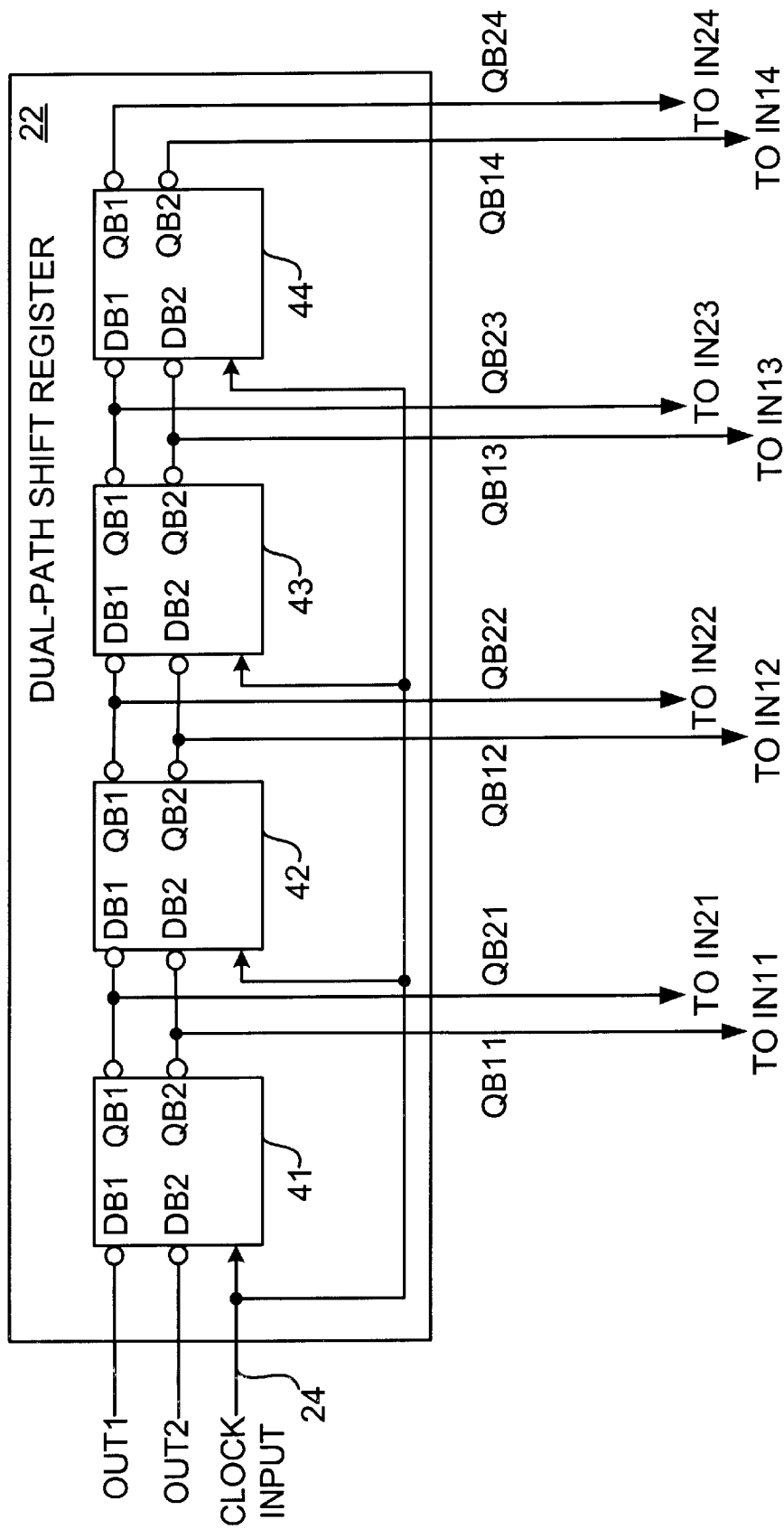
FIG. 3 is a detailed block diagram of a dual-path shift register within the SEU immune frequency divider circuit from FIG. 2, in accordance with a preferred embodiment of the present invention.

Referring now to FIG. 3, there is depicted a detailed block diagram of dual-path shift register 22, in accordance with the preferred embodiment of the present invention. As shown, dual-path shift register 22 includes four dual-path D-type flip-flip (DFF) circuits 41–44. DFF circuits 41–44 function as a pseudo shift register where the inverted output of one DFF circuit feeds the inverting input of the next DFF. Specifically, the two inverted outputs of DFF circuit 41 (QB11–QB21) are separately connected to the two inverting inputs of DFF circuit 42; the two inverted outputs of DFF circuit 42 (QB12–QB22) are separately connected to the two inverting inputs of DFF 43; and the two inverted outputs of DFF circuit 43 (QB13–QB23) are separately connected to the two inverting inputs of DFF circuit 44. In addition, outputs QB11 and QB21 are connected to inputs IN11 and IN21 of dual-path multiplexor 23 (from FIG. 2), respectively. Similarly, outputs QB12 and QB22 are connected to inputs IN12 and IN22 of dual-path multiplexor 23, respectively; outputs QB13 and QB23 are connected to inputs IN13 and IN23 of dualpath multiplexor 23, respectively; and outputs QB14 and QB24 are connected to inputs IN14 and IN24 of dual-path multiplexor 23, respectively. The clock inputs of DFF circuits 41–44 are all connected to clock input 24.

Figure 7:
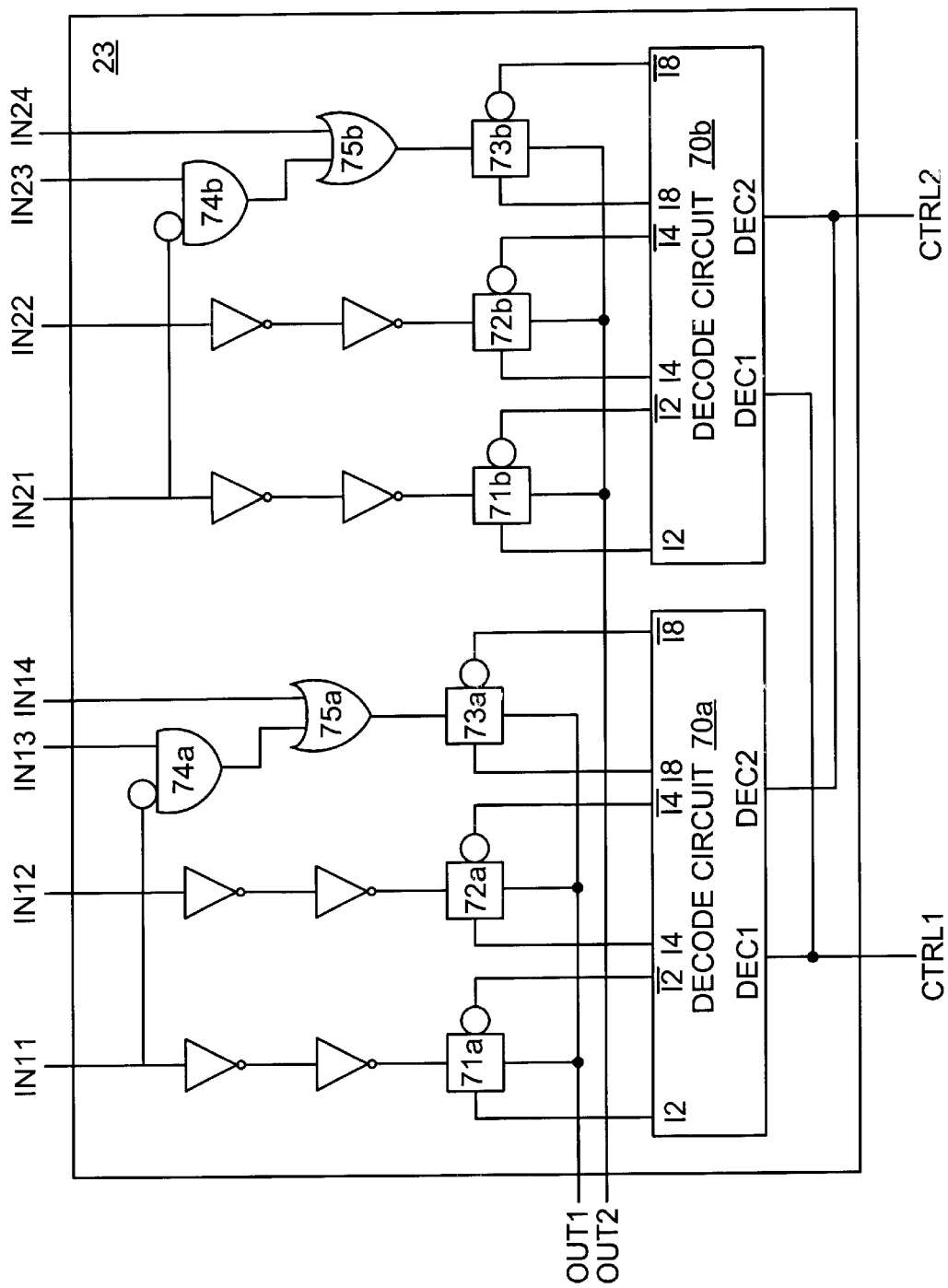
FIG. 7 is a detailed block diagram of a dual-path multiplexor within the SEU immune frequency divider circuit from FIG. 2, in accordance with a preferred embodiment of the present invention.

As will be further explained in FIG. 7, for an one-half signal division, the two inverted outputs of DFF circuit 41 (QB11–QB21) are fed back into the two inverting inputs of DFF circuit 41 by dual-path multiplexor 23. For an one-fourth signal division, the two inverted outputs of DFF 42 (QB12–QB22) are fed back into the two inverting inputs of DFF circuit 41 by dual-path multiplexor 23. For an one-eighth signal division, the inverted outputs of DFF circuits 41 and 43–44 (QB11–QB21, QB13–QB23 and QB14–QB24) are fed back into the two inverting inputs of DFF circuit 41 by dual-path multiplexor 23.

Figure 4:
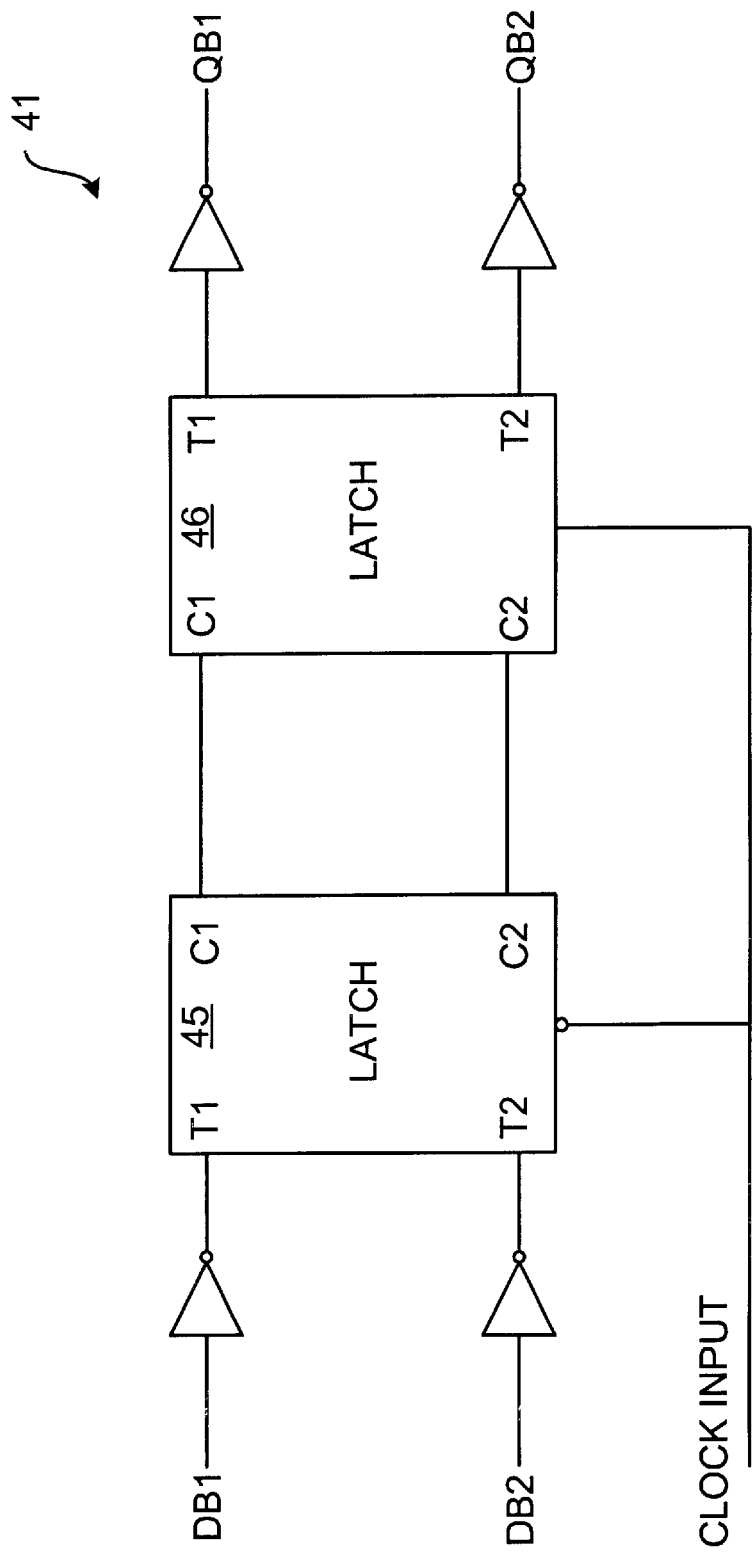
FIG. 4 is a schematic diagram of a dual-path D-type flip-flop circuit within the dual-path shift register from FIG. 3, in accordance with a preferred embodiment of the present invention.

Since DFF circuits 41–44 are identical, only DFF circuit 41 will be further illustrated. With reference now to FIG. 4, there is depicted a schematic diagram of DFF circuit 41, in accordance with a preferred embodiment of the present invention. As shown, DFF circuit 41 includes an SEU latch 45 and an SEU latch 46. Each of the two inputs of SEU latch 45 is connected to an inverter. Each of the two outputs of SEU latch 45 is connected to a respective input of SEU latch 46. Each of the two outputs of SEU latch 46 is connected to an inverter to provide an output for DFF circuit 41. SEU latch 45 and SEU latch 46 share a common clock input.

Figure 5:
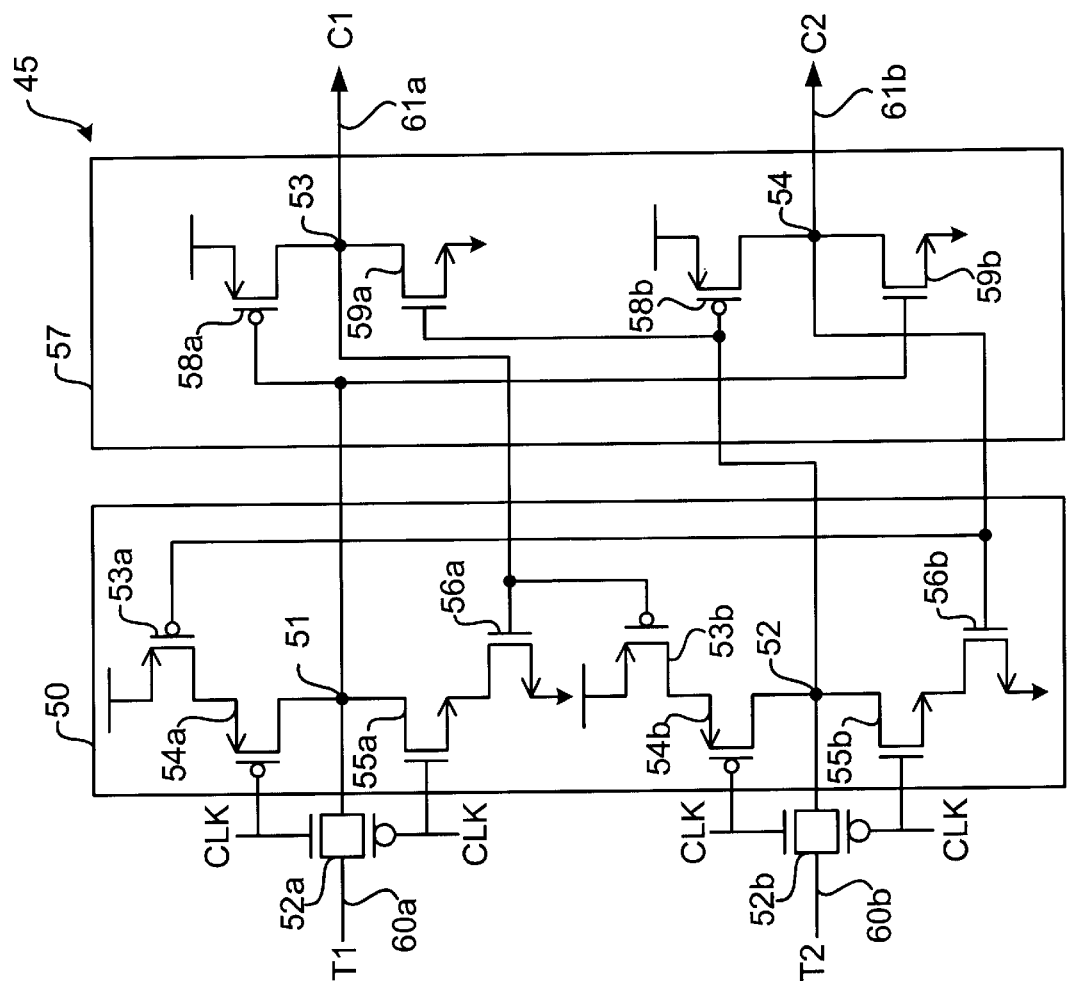
FIG. 5 is a schematic diagram of a first SEU latch within the dual-path D-type flip-flop circuit from FIG. 4, in accordance with a preferred embodiment of the present invention.

Referring now to FIG. 5, there is depicted a schematic diagram of SEU latch 45 from FIG. 4, in accordance with a preferred embodiment of the present invention. As shown, SEU latch 45 includes a cross-coupled tri-state inverter 50 and a cross-coupled inverter 57. Cross-coupled tri-state inverter 50 includes a first tri-state inverter connected to a second tri-state inverter in a cross-coupled fashion. The first tri-state inverter includes two serially connected p-channel transistors 53a–54a connected in series with two serially connected n-channel transistors 55a–56a. Similarly, the second tri-state inverter includes two serially connected p-channel transistors 53b–54b connected in series with two serially connected n-channel transistors 55b–56b. The gate of transistor 56a is connected to the gate of transistor 53b to provide a first feedback input for cross-coupled tri-state inverter 50, and the gate of transistor 53a is connected to the gate of transistor 56b to provide a second feedback input for cross-coupled tri-state inverter 50. The first forward input for cross-coupled tri-state inverter 50 is from the gate of transistor 54a and the gate of transistor 55a. The second forward input for cross-coupled tri-state inverter 50 is from the gate of transistor 54b and the gate of transistor 55b.

Cross-coupled inverter 57 includes a first inverter connected to a second inverter in a cross-coupled fashion. The first inverter includes a p-channel transistor 58a connected in series with an n-channel transistor 59a. Similarly, the second inverter includes a p-channel transistor 58b connected in series with an n-channel transistor 59b. The gate of transistor 58a is connected to the gate of transistor 59b to provide a first forward input for cross-coupled inverter 57, and the gate of transistor 59a is connected to the gate of transistor 58b to provide a second forward input for cross-coupled inverter 57. A first output 61a of cross-coupled inverter 57 is provided at a node S3 between transistor 58a and transistor 59a. A second output 61b of cross-coupled inverter 57 is provided at a node S4 between transistor 58b and transistor 59b.

Cross-coupled inverter 57 is connected to cross-coupled tri-state inverter 50. Specifically, first output of cross-coupled inverter 57 (i.e., node S3) is fed back to the first feedback input of cross-coupled tri-state inverter 50 (i.e., the gates of transistors 56a and 53b). Also, second output 61b of cross-coupled inverter 57 (i.e., node S4) is fed back to the second feedback input of cross-coupled tri-state inverter 50 (i.e., the gates of transistors 53a and 56b).

During operation, data enter through an input 60a. A transmission gate 52a allows data to enter cross-coupled tri-state inverter 50 when the clock signal CLK at clock input 24 (from FIG. 3) is at a logical low state. Concurrently, data also enter through an input 60b. A transmission gate 52b allows data to enter cross-coupled tri-state inverter 50 when the clock signal CLK at clock input 24 is at a logical low state.

Since transistors 54a–55a and transistors 54b–55b are turned off when clock signal CLK is at a logical low state, data from input 60a are sent to a storage node S1 (i.e., the first forward input of cross-coupled inverter 57), and data from input 60b are sent to a storage node S2 (i.e., the second forward input of cross-coupled inverter 57). If the data at input 60a and input 60b are both, for example, logical "1's," then transistors 59a and 59b are turned on such that a logical "0" is showed up at both outputs 61a and 61b. The logical "0's" at outputs 61a and 61b are then converted to logical "1's" by inverters 62a and 62b, respectively. If the signals at inputs 60a and 60b are both, for example, logical "1's," then transistors 59a and 59b are turned on such that logical "0's" show up at both output 61a and output 61b. Nodes S3 and S4, at outputs 61a and 61b, respectively, are considered as non-inverting nodes.

When the clock signal CLK at clock input 24 is at a logical high state, then DFF circuit 41 holds the data from a previous cycle. For example, if nodes S1 and S2 are both at logical "1's" at the previous cycle, that means nodes S3 and S4 are both at logical "0's" at the previous cycle. The logical "0's" from nodes S3 and S4 are also sent to the first feedback input of cross-coupled tri-state inverter 50 (i.e., the gates of transistors 56a and 53b) and the second feedback input of cross-coupled tri-state inverter 50 (i.e., the gates of transistors 53a and 56b), respectively. The logical "0" from node S3 turns on transistor 53b; thus, the logical "1" at node S2 is maintained. The logical "0" from node S4 turns on transistor 53a; thus, the logical "1" at node S1 is maintained.

On the other hand, if nodes S1 and S2 are both at logical "0's" at the previous cycle, that means nodes S3 and S4 are both at logical "1's" at the previous cycle. The logical "1's" from nodes S3 and S4 are also sent to the first feedback input of cross-coupled tri-state inverter 50 and the second feedback input of cross-coupled tri-state inverter 50, respectively. The logical "1" from node S3 turns on transistor 56a; thus, the logical "0" at node S1 is maintained. The logical "1" from node S4 turns on transistor 56b; thus, the logical "0" at node S2 is maintained.

When writing to nodes S1 and S2, if the signal at input 60a is a logical "1" and the signal at input 60b is a logical "0" (or vice versa) due to an incident of single-effect upset, then the inadvertently written state will not be held when clock signal CLK becomes high. For example, if node S1 is at logical "1," node S2 is at logical "1," node S3 is at logical "0," and node S4 is at logical "0" before a write cycle. Due to an SEU, a logical "1" is written to node S1 and a logical "0" is written to node S2, which leads node S3 being the same state and node S4 will be at logical "0" or "1." The logical "0" from node S3 turns on transistor 53b and node S2 will be changed to logical "1". The logical "1" from node S4 turns on transistor 56b, and node S2 will be changed to logical "0" at node S2.

Figure 6:
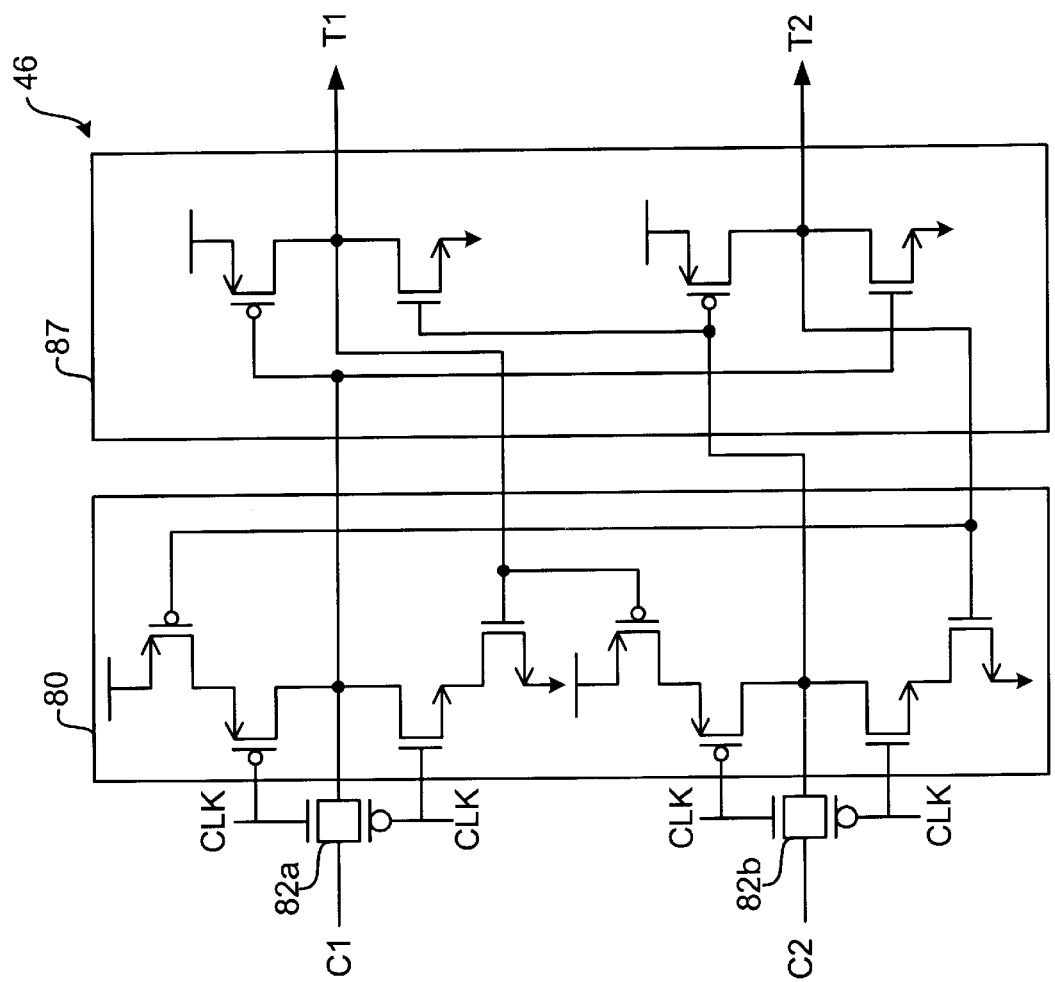
FIG. 6 is a schematic diagram of a second SEU latch within the dual-path D-type flip-flop circuit from FIG. 4, in accordance with a preferred embodiment of the present invention.

With reference now to FIG. 6, there is depicted a schematic diagram of SEU latch 46 from FIG. 4, in accordance with a preferred embodiment of the present invention. As shown, SEU latch 46 includes a cross-coupled tri-state inverter 80 and a cross-coupled inverter 87. Cross-coupled tri-state inverter 80 is identical to cross-coupled tri-state inverter 50 from FIG. 5, and cross-coupled inverter 87 is identical to cross-coupled inverter 57 from FIG. 5. The main difference between SEU latch 46 and SEU latch 45 is that the clock input to transmission gates 82a and 82b. As a result, transmission gate 82a allows data to enter cross-coupled tri-state inverter 80 when the clock signal CLK at clock input 24 (from FIG. 3) is at a logical high state. Concurrently, transmission gate 82b allows data to enter cross-coupled tri-state inverter 80 when the clock signal CLK at clock input 24 is at a logical high state.

Referring now to FIG. 7, there is depicted a detailed block diagram of dual-path multiplexor 23, in accordance with a preferred embodiment of the present invention. As shown, dual-path multiplexor 23 includes two decode circuits 70a–70b and multiple logic gates for coupling eight inputs to decode circuits 70a–70b. The eight inputs can be grouped into four input pairs, namely, input pair IN11–IN21, input pair IN12–IN22, input pair IN13–IN23 and input pair IN14–IN24. One or more of the four input pairs can be directed by decode circuits 70a–70b as outputs at output pair OUT1–OUT2 via control inputs CTRL1 and CTRL2. Specifically, decode circuit 70a turns on one of transfer gates 71a–73a, according to control inputs CTRL1 and CTRL2, to allow signals at one or more of the inputs IN11, IN12, IN13 and IN14 to transfer to output OUT1. Similarly, decode 70b turns on one of transfer gates 71b–73b, according to control inputs CTRL1 and CTRL2, to allow signals at one or more of the inputs IN21, IN22, IN23 and IN24 to transfer to output OUT2. In essence, control inputs CTRL1 and CTRL2 dictate which two outputs of one of DFF circuits 41–44 (from FIG. 2) to be fed back into the two inputs of DFF circuit 41 and the two inputs of summing circuit 21 (from FIG. 2) in order to control the output frequency of frequency divider 20 (from FIG. 2).

For an one-half signal division, transmission gates 71a and 71b will be turned on to allow input pair IN11–IN21 (i.e., the two inverted outputs from DFF circuit 41) to be fed back into the two inverting inputs of DFF circuit 41. For an one-fourth signal division, transmission gates 72a and 72b will be turned on to allow input pair IN12–IN22 (i.e., the two inverted outputs of DFF 42) to be fed back into the two inverting inputs of DFF circuit 41. For an one-eighth signal division, transmission gates 73a and 73b will be turned on to allow input pairs IN11–IN21, IN13–IN23 and IN14–IN24 (i.e., the inverted outputs of DFF circuits 41 and 43–44) to be fed back into the two inverting inputs of DFF circuit 41. In the present example, an AND gate 74a and an OR gate 75a are used to combine the inputs IN11, IN13 and IN14 for transmission gate 73a, and an AND gate 74b and an OR gate 75b are used to combine the inputs IN21, IN23 and IN24 for transmission gate 73b. However, it is understood by those skilled in the art that any combination of logic gates can be utilized to perform the function of logic gates 74a, 75a, 74b and 75b.

As has been described, the present invention provides a SEU immune frequency divider circuit.

While the invention has been particularly shown and described with reference to a preferred embodiment, it will be understood by those skilled in the art that various changes in form and detail may be made therein without departing from the spirit and scope of the invention.

What is claimed is:

1. A single-event upset immune frequency divider circuit, comprising:

a dual-path shift register having a clock input, a signal input pair, and a plurality of signal output pairs, wherein said clock input receives an input clock signal;

a dual-path multiplexor having a plurality of signal input pairs and an output pair, wherein said plurality of signal input pairs are respectively connected to said plurality of signal output pairs of said dual-input shift register, wherein one of said signal output pairs of said dual-path shift register is selected by said dual-path multiplexor to feed back into said signal input pair of said dual-path shift register; and a summing circuit for summing said output pair of said dual-path multiplexor to generate an output clock signal, wherein said output clock signal is a fraction of the frequency of said input clock signal.

2. The circuit of claim 1, wherein said dual-path multiplexor circuit includes a plurality of decode circuits.

3. The circuit of claim 2, wherein one of said plurality of decode circuits includes a plurality of control inputs.

4. The circuit of claim 1, wherein said summing circuit includes a dual-input inverter.

5. The circuit of claim 1, wherein said dual-path shift register includes a plurality of dual-input flip-flop circuits.

6. The circuit of claim 5, wherein one of said dual-input flip-flop circuits includes a first single-event upset latch and a second single-event upset latch.

7. The circuit of claim 6, wherein each of said first single-event upset latch and said second single-event upset latch includes a cross-coupled tri-state inverter and a cross-coupled inverter.

8. The circuit of claim 7, wherein said cross-coupled tri-state inverter includes four p-channel transistors and four n-channel transistors connected in series.

9. The circuit of claim 7, wherein said cross-coupled inverter includes two p-channel transistors and two n-channel transistors connected in series.

10. A single-event upset immune frequency divider circuit, comprising:
- a dual-path shift register having a clock input, a signal input pair, and at least four signal output pairs, wherein said clock input receives an input clock signal;
- a dual-path multiplexor having at least four signal input pairs and an output pair, wherein said at least four signal input pairs are respectively connected to said at least four signal output pairs of said dual-input shift register, wherein one of said at least four signal output pairs of said dual-path shift register is selected by said dual-path multiplexor to feed back into said signal input pair of said dual-path shift register; and
- a summing circuit for summing said output pair of said dual-path multiplexor to generate an output clock signal, wherein said output clock signal is a fraction of the frequency of said input clock signal.

11. The circuit of claims 10, wherein said dual-path multiplexor circuit includes a plurality of decode circuits.

12. The circuit of claim 11, wherein one of said plurality of decode circuits includes a plurality of control inputs.

13. The circuit of claim 10, wherein said summing circuit includes a dual-input inverter.

14. The circuit of claim 10, wherein said dual-path shift register includes a plurality of dual-input flip-flop circuits.

15. The circuit of claim 14, wherein one of said dual-input flip-flop circuits includes a first single-event upset latch and a second single-event upset latch.

16. The circuit of claim 15, wherein each of said first single-event upset latch and said second single-event upset latch includes a cross-coupled tri-state inverter and a cross-coupled inverter.

17. The circuit of claim 16, wherein said cross-coupled tri-state inverter includes four p-channel transistors and four n-channel transistors connected in series.

18. The circuit of claim 16, wherein said cross-coupled inverter includes two p-channel transistors and two n-channel transistors connected in series.

* * * * *